United States Patent [19]

Magel et al.

[11] Patent Number: 5,412,593
[45] Date of Patent: May 2, 1995

[54] FUSE AND ANTIFUSE REPROGRAMMABLE LINK FOR INTEGRATED CIRCUITS

[75] Inventors: Gregory A. Magel, Dallas; Richard A. Stoltz, Plano, both of Tex.

[73] Assignee: Texas Instruments Incorporated, Dallas, Tex.

[21] Appl. No.: 180,581

[22] Filed: Jan. 12, 1994

[51] Int. Cl.⁶ ............................................ H03K 19/173
[52] U.S. Cl. ......................................... 365/96; 365/94; 365/225.7
[58] Field of Search ................. 365/96, 94, 102, 104, 365/225.7

[56] References Cited

U.S. PATENT DOCUMENTS

| | | | |
|---|---|---|---|
| 4,209,894 | 7/1980 | Keen | 29/577 |
| 4,507,757 | 3/1985 | McElroy | 365/104 |
| 4,752,118 | 6/1988 | Johnson | 350/334 |
| 4,823,320 | 4/1989 | Smayling et al. | 365/189 |
| 4,899,205 | 2/1990 | Hamdy et al. | 257/530 |
| 4,914,055 | 4/1990 | Gordon et al. | 257/530 |
| 4,942,538 | 7/1990 | Mohsen et al. | 437/193 |
| 4,943,538 | 7/1990 | Mohsen et al. | 437/52 |
| 5,087,589 | 2/1992 | Chapman et al. | 437/195 |
| 5,095,362 | 3/1992 | Roesner | 257/330 |
| 5,100,827 | 3/1992 | Lytle | 158/DIG. 55 |
| 5,120,679 | 6/1992 | Boardman et al. | 148/DIG. 55 |
| 5,134,457 | 7/1992 | Hamdy et al. | 257/530 |
| 5,154,557 | 2/1992 | Chapman et al. | 437/195 |
| 5,166,556 | 11/1992 | Hsu et al. | 437/922 |
| 5,166,557 | 11/1992 | Chen et al. | 307/468 |
| 5,171,715 | 12/1992 | Husher et al. | 148/DIG. 55 |
| 5,181,096 | 1/1993 | Forouhi | 257/50 |
| 5,196,724 | 3/1993 | Gordon et al. | 257/530 |
| 5,200,652 | 4/1993 | Lee | 365/96 |
| 5,233,217 | 8/1993 | Dixit et al. | 251/530 |
| 5,321,322 | 6/1994 | Verheyen et al. | 365/102 |

FOREIGN PATENT DOCUMENTS

| | | | |
|---|---|---|---|
| 25347 | 3/1981 | European Pat. Off. | 257/529 |
| 9958 | 1/1984 | Japan | 257/529 |
| 154038 | 9/1984 | Japan | 148/DIG. 55 |
| 128640 | 7/1985 | Japan | 148/DIG. 55 |

OTHER PUBLICATIONS

Silicon processing for the VLSI ERA, vol. 2 process integration, Wolf, p. 127, Lattice Press.

*Primary Examiner*—Do Hyun Yoo
*Assistant Examiner*—Vu Le
*Attorney, Agent, or Firm*—Kay Houston; Richard A. Stoltz; Richard L. Donaldson

[57] ABSTRACT

A fuse and antifuse link structure, which when used with a memory integrated circuit device such as a gate array or programmable mad-only memory (PROM), allows the memory circuit to be reprogrammed. The fuse and antifuse link is comprised of a fuse 12 and an antifuse 16, connected in series, parallel, or a combination thereof. Either element of the link can be programmed initially, and the other can be programmed in a second step, to reverse the first programming. Several links can be used in one circuit to provide multiple reprogramming capability.

23 Claims, 6 Drawing Sheets

FUSE AND ANTIFUSE REPROGRAMMABLE LINK FOR INTEGRATED CIRCUITS

CROSS-REFERENCES TO RELATED APPLICATIONS

For related applications, refer to Ser. No. 08/079,194 entitled Metal-to-metal Antifuse Structure, (Texas Instruments case number T-17472), filed on Jun. 17, 1993, by Tigelaar et al; and Ser. No. 914,151, entitled Method of Forming Low Resistance Antifuses, (TI case number T-15266), filed on Jul. 14, 1992, by Tigelaar et al.

BACKGROUND OF THE INVENTION

Field of the Invention

The invention relates generally to integrated circuits, and more particularly to memory devices such as programmable gate arrays or PROMs (Programmable Read-Only Memory).

Poly-silicon ("poly") fuses are well known in prior art and have been used often in redundancy schemes for memory applications and for trimming resistors to set voltage reference levels in analog applications. Poly fuses are conductive links until a high current pulse is sent through them, causing them to melt and form an open circuit.

More recently, antifuses which can consist of a thin dielectric between two conductors have been introduced into Field Programmable Gate Array products. Antifuses start out as circuit opens and are "blown" by applying a high voltage pulse causing the dielectric to rupture, forming a closed circuit. U.S. Pat. No. 4,943,538 entitled "Programmable Low Impedance Anti-fuse Element" filed on Mar. 10, 1988 by Mahsen et al describes such an antifuse, with a capacitor-like structure having very low leakage before programming and a low resistance after programming.

Another form of antifuse consists of a region of amorphous material of high resistivity placed between two conductors. To change the amorphous material from high resistivity to a conductor, current is passed through the amorphous material, heating it and converting it to a highly conductive state. This type of antifuse is described in U.S. Pat. No. 4,752,118 entitled "Electric Circuits Having Repairable Circuit Lines and Method of Making the Same" filed on Oct. 14, 1986 by Johnson.

SUMMARY OF THE INVENTION

While several patents have been issued for the production of fuses and antifuses, nothing in prior art suggests or teaches one or more fuses and antifuses used together as a reprogrammable link in an integrated circuit.

There are several types of electronic devices that can be reprogrammed (i.e. programmed more than once), such as PROMs (Erasable-Programmable Read-Only Memory), EEPROMs (Electrically Erasable-Programmable Read-Only Memory), or SRAMs (Static Random Access Memory). The circuits that are programmed are transistor-based, but are rather large, taking up space on the integrated circuit.

Other devices, such as the typical Gate Arrays or PROMs, can be programmed only once. These devices have constructed links made of a single fuse or antifuse, and no reprogramming or correction of errors in the programming of routings is possible (other than a hard-wire or "external jumper" to the packaged IC). A PROM or Gate Array that has been misprogrammed is generally discarded as unusable. Therefore, if such a device had the capability of being reprogrammed, programming scrap costs would be reduced. Further, it is common for engineering changes to be made which require memory devices to be reprogrammed. Again, costs could be reduced if such a device could be programmed more than once.

In the new invention, a link is comprised of series, parallel, or both, combinations of fuses and antifuses. Such a link allows two or more programming steps. Multiple sublinks can be connected in various ways, providing for multiple reprogramming steps.

There are many advantages to the fuse and antifuse link invention, a very important one being that the area requirement for the fuse and antifuse link is less than for transistor-based programming elements. The fuse and antifuse structures can be built vertically on the semiconductor wafer, whereas the transistors for reprogramming cells for PROMs, EEPROMs and SRAMs are generally built in a single crystal substrate, located horizontally next to the logic transistors. The fuse and antifuse link may, for example, take up an 0.8 $\mu m^2$ area, versus an SRAM cell at 70 $\mu m^2$, and an EEPROM cell at 7.25 $\mu m^2$. This equates to semiconductor real estate savings ranging from 89% to 99%.

Other advantages are reprogrammability, decreased scrap costs, lower resistance, lower expense, ease of implementation, radiation hardness, and in situ test capability. With the fuse and antifuse link of this invention, memory devices such as PROMs and Gate Arrays that in the past have not been reprogrammable may now be reprogrammed many times. Design changes, updates, or corrections are capable of being implemented, reducing the number of finished integrated circuits that must be scrapped. Also, the resistance of a metal to metal antifuse is 50 ohms or less, versus an EEPROM transistor-based cell that has a resistance of thousands of ohms. The lower resistance provides less signal degradation and thus, better performance of the circuit. In addition, the fuse and antifuse structures required for a small number of programming steps are physically small and inexpensive to implement. The fuse and antifuse structures are more radiation hard than the transistor-based cells of PROMs, EEPROMs and SRAMs, which can be erroneously misprogrammed fairly easily. Another advantage made possible by in-circuit reprogramming include allowing a manufacturer to test chips in situ before shipping: gates can be tested independently of the links for Quality Assurance by using one programming step. The fuse and antifuse link is an inexpensive, space-conserving way to make a memory device reprogrammable.

Several embodiments are described, all of which provide the novel capability of reprogramming these previously "once-only" programmable devices.

BRIEF DESCRIPTION OF THE DRAWINGS

In the drawings, which form an integral part of the specification and are to be read in conjunction therewith, and in which like numerals and symbols are employed to designate similar components in various views unless otherwise indicated.

Figure 3A:
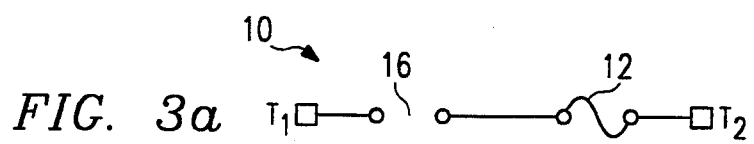
Figure 3B:
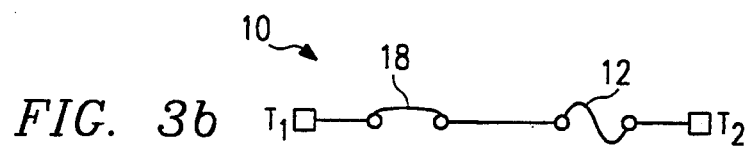
Figure 3C:
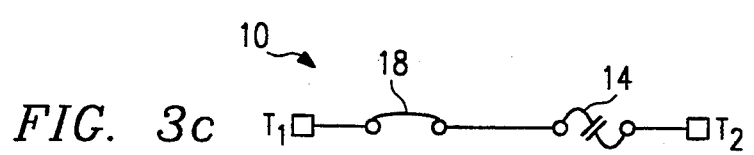
Figure 4A:
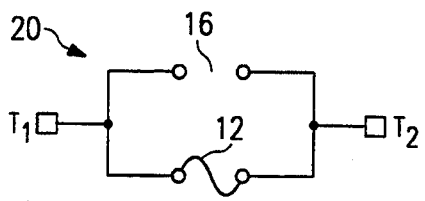
Figure 4B:
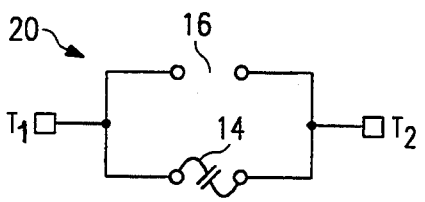
Figure 4C:
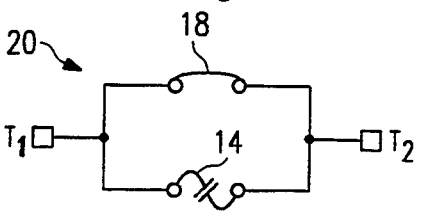
Figure 5:
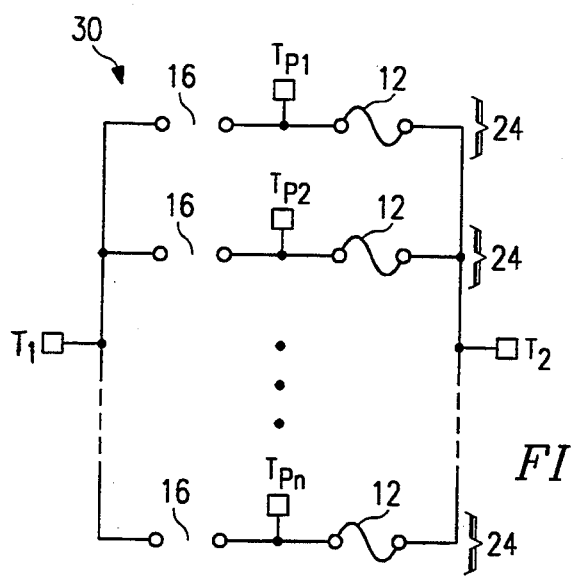
Figure 6:
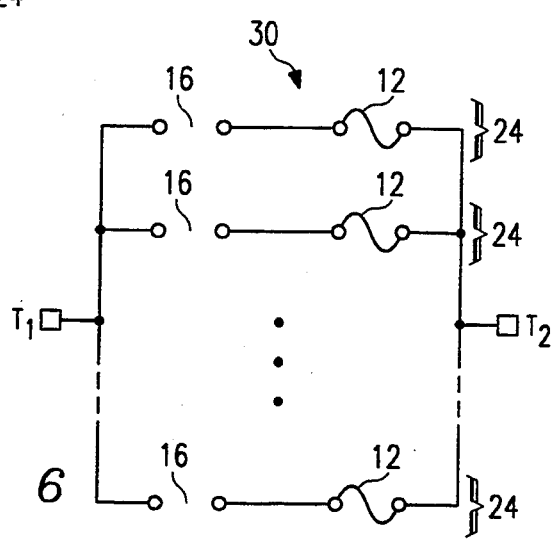
Figure 7:
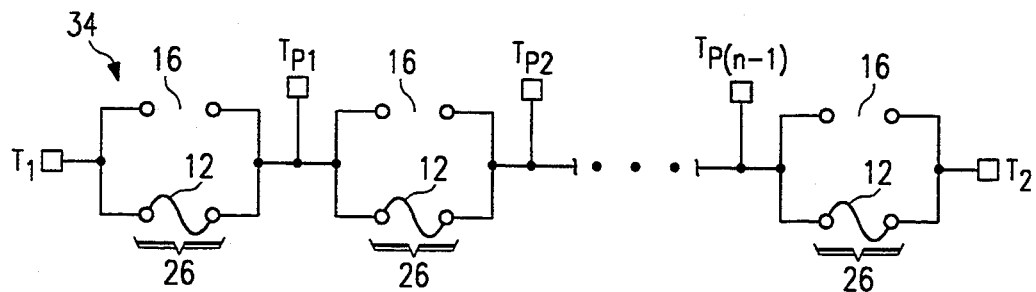
Figure 8:
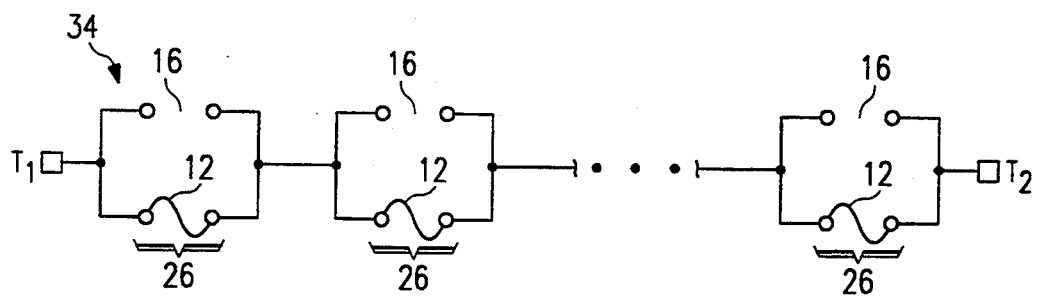
Figure 9A:
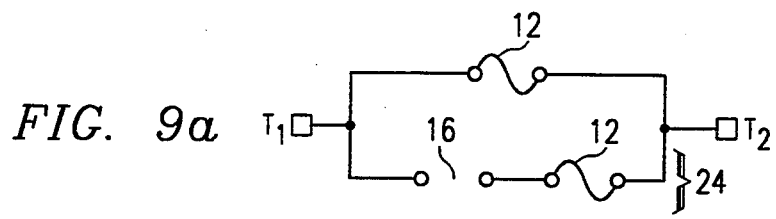
Figure 9B:
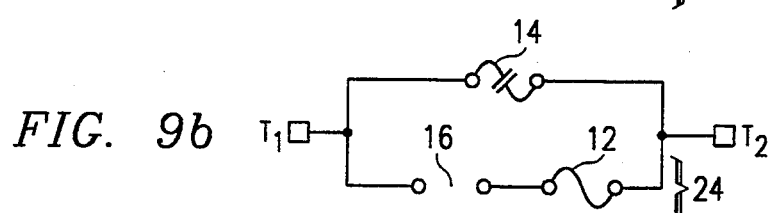
Figure 9C:
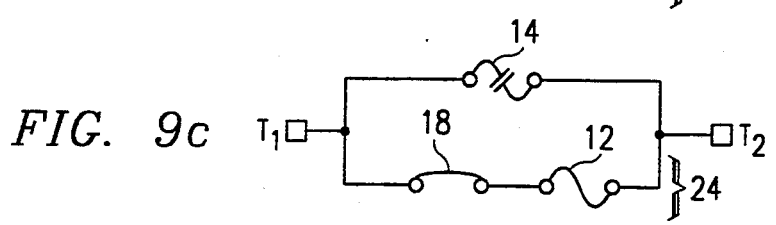
Figure 9D:
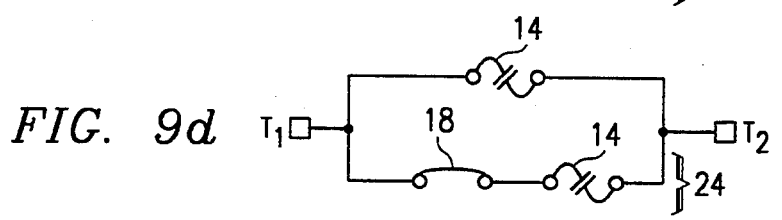
Figure 10:
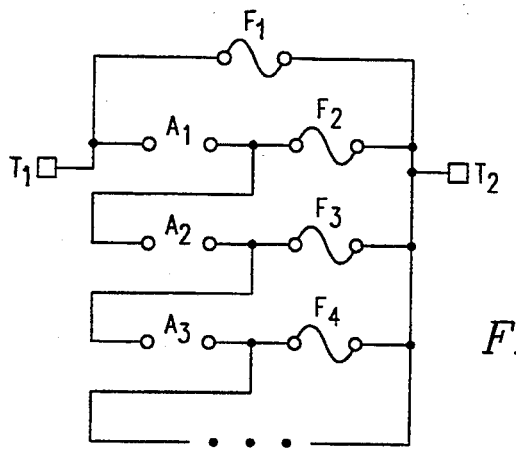
Figure 11A:
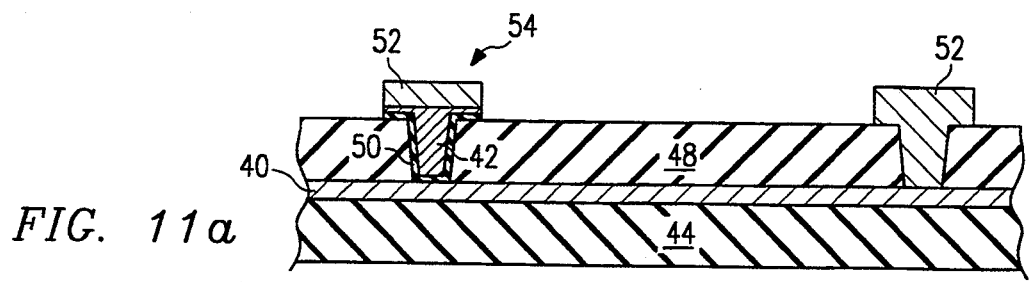
Figure 11B:
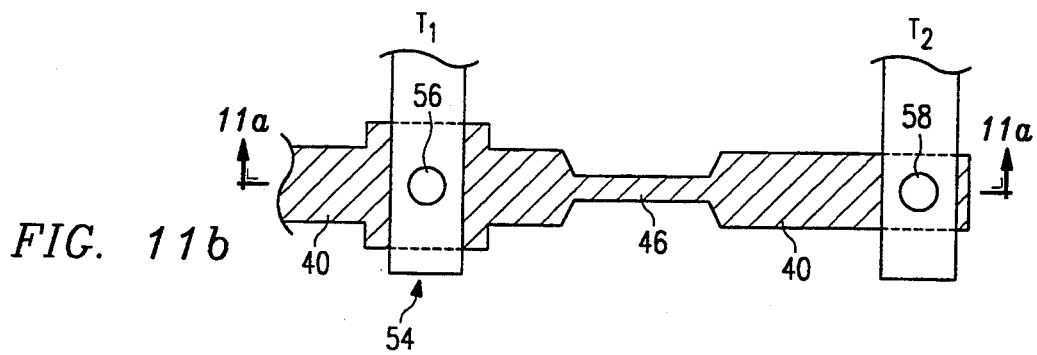
Figure 11C:
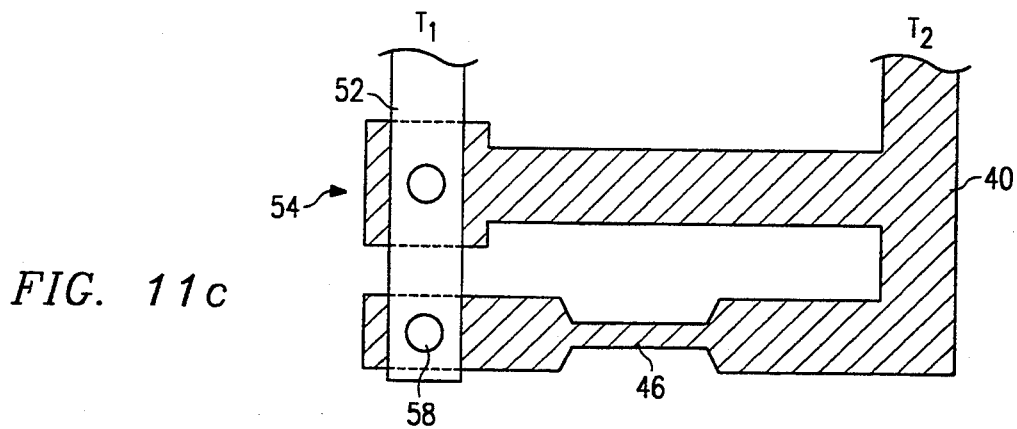
Figure 12A:
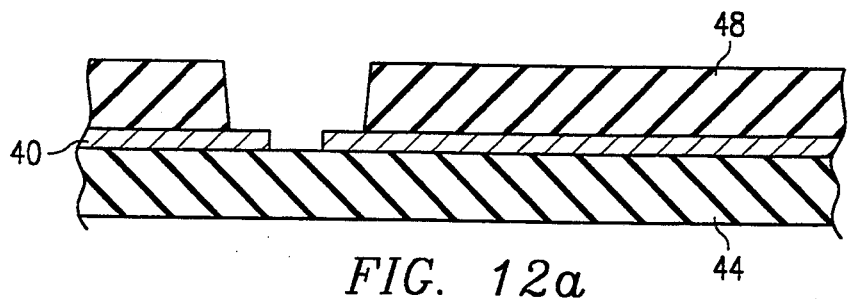
Figure 12B:
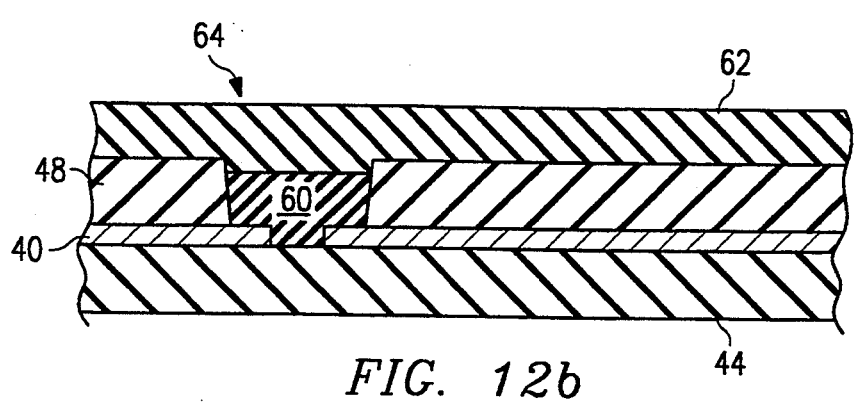
Figure 12C:
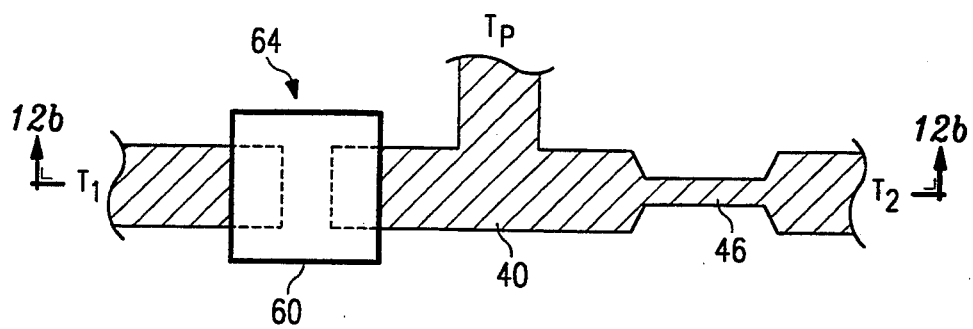

2a) the initial state (link open), 2b) after first programming (link shorted), 2c) after second programming (link open);

FIGS. 3a through 3c show the series fuse and antifuse link without a programming node;

FIGS. 4a–4c show a parallel fuse and antifuse link allowing two programming steps, where the states depicted are:

4a) initial state (link shorted), 4b) after first programming (link open), 4c) after second programming (link shorted);

FIG. 5 shows a link consisting of the parallel connection of n series sublinks, to allow 2n programming steps, with programming nodes;

FIG. 6 shows a link consisting of the parallel connection of n series sublinks, without programming nodes, utilizing antifuses activated by different voltages;

FIG. 7 shows a link consisting of the series connection of n parallel sublinks to allow 2n programming steps, with programming nodes;

FIG. 8 shows a link consisting of the series connection of n parallel sublinks to allow 2n programming steps, without programming nodes, utilizing fuses of different current ratings;

FIGS. 9a through 9d shows an alternate embodiment with an antifuse and a fuse in series, connected in parallel with a second fuse, allowing three programming steps;

FIG. 10 shows an alternate embodiment with several fuses and antifuses connected together such that many programming states can be achieved, without a programming node;

FIGS. 11a–11c are a preferred embodiment of a fuse and antifuse link using dielectric breakdown antifuse, where:

11a) is a cross-section of the structure, 11b) is a top view of the conductive portions of the series link, 11c) is a top view of the conductive portions of a parallel link;

FIGS. 12a–12c show an alternate embodiment of a series link incorporating an antifuse using amorphous-Si to poly-Si conversion, where:

12a) is a cross-section of the structure before deposition of the amorphous-Si plug, 12b) is a cross-section of the completed antifuse structure, 12c) is a top view of the conductive portions of the series link.

Figure 13:
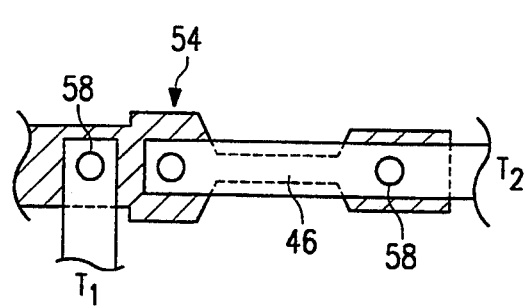
Figure 14A:
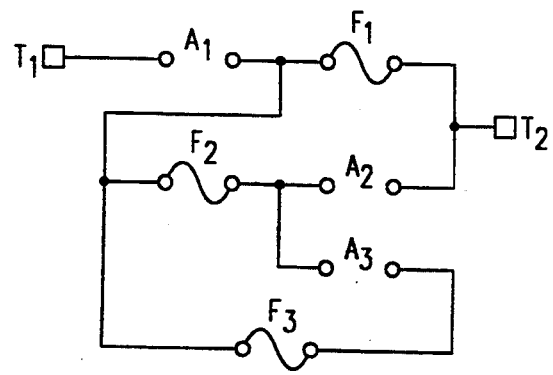
Figure 14B:
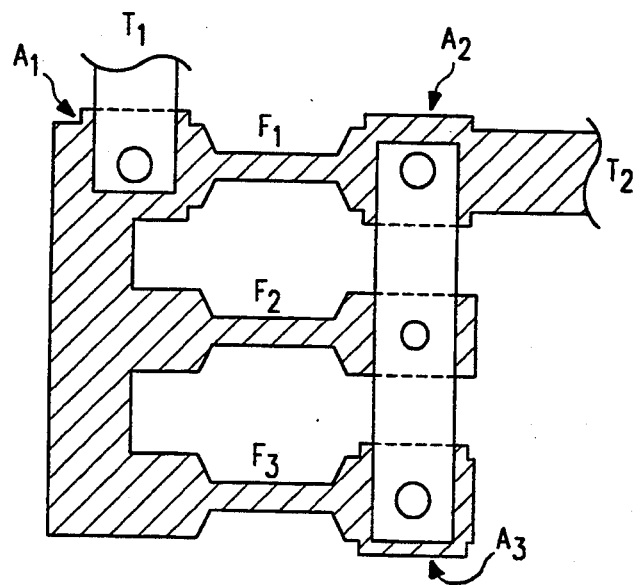

FIG. 13 shows an embodiment of a parallel link in which the fuse and antifuse link takes up approximately the same amount of space as a single fuse element, and;

FIGS. 14a–14b show an alternate embodiment called a "six-pack", with three antifuses and three fuses, where:

14a) is a schematic diagram of the circuit, and 14b) is a top view of the conductive portions of the circuit.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of several preferred embodiments and alternative embodiments, including schematic representations and manufacturing methods. Corresponding numerals and symbols in the different figures refer to corresponding parts unless otherwise indicated. Table 1 below provides an overview of the elements of the embodiments and the drawings.

TABLE 1

| Drawing Element | Generic Term | Specific Examples or Alternates |
| --- | --- | --- |
| $T_1$ | Input Terminal 1 | |
| $T_2$ | Input Terminal 2 | |
| $T_P$ | Programming Terminal | $T_{P1} \ldots T_{PN}$ multiple terminals |
| 10 | Series Fuse/Antifuse Link | |
| 12 | Schematic symbol for fuse in initial state; shorted | |
| 14 | Schematic symbol for fuse in "written" state; open | |
| 16 | Schematic symbol for antifuse in initial state; open | |
| 18 | Schematic symbol for antifuse in "written" state; shorted | |
| 20 | Parallel Fuse and Antifuse Link | |
| 24 | Series Sublink | Fuse and Antifuse in series |
| 26 | Parallel Sublink | Fuse and Antifuse in parallel |
| 30 | Array of series sublinks | Multiple parallel connection of drawing element 24 |
| 34 | Array of parallel sublinks | Multiple series connection of drawing element 26 |
| 40 | Poly, first layer | 4500 Å of polysilicon |
| 42 | Poly, second layer | |
| 44 | Field oxide | |
| 46 | Fuse link | |
| 48 | Isulating oxide | MLO oxide |
| 50 | Antifuse dielectric | |
| 52 | Metal 1 | |
| 54 | Antifuse, dielectric breakdown type | |
| 56 | antifuse opening | |
| 58 | contact | |
| 60 | amorphous silicon plug | |
| 62 | passivating layer | |
| 64 | Antifuse, amorphous silicon type | |
| A | Antifuse | $A_1$ = first antifuse; Higher voltage antifuse; Lower voltage antifuse. |
| F | Fuse | $F_1$ = first fuse; Higher current fuse; Lower current fuse. |

First, terms will be defined which are used to describe the invention. A "link" refers to the connection between circuit elements (called "gates") which is either connected or disconnected in the programming process which configures the gate array or memory. In current practice, a link is either a single fuse or antifuse; in this invention, a link is comprised of combinations of fuses and antifuses. A "fuse" is a circuit element which is initially a short, which in the programming process can be opened, typically with the passage of a high current through it. An "antifuse" is the opposite of a fuse in that it is initially open, and during programming, typically by placing a high voltage across it to "punch through" a thin insulating layer, can be converted into a short.

Figure 1:
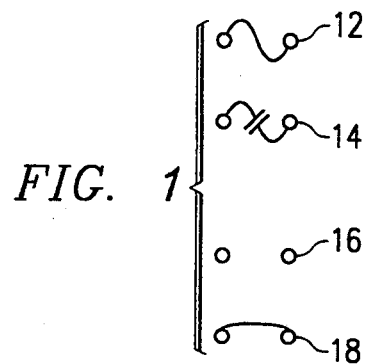
FIG. 1 shows schematic symbols for reprogrammable link components.

Schematic symbols for fuses and antifuses as used herein are defined in FIG. 1; these symbols will be used in subsequent figures describing the fuse and antifuse link invention. Drawing element 12 is a schematic symbol for a fuse in the initial state, which is shorted. A fuse in the written state, an open, is shown in drawing element 14. Drawing element 16 is a schematic symbol for an antifuse in the initial state, which is an open. The antifuse in the written state, a short, is shown in drawing element 18.

Programing steps, in which opens are converted into shorts, or vice versa, to change the state of the links, had been, for practical purposes, irreversible for the single-element links of the prior art. It is this irreversibility which the invention is intended to circumvent by allowing the state of links to be reversed by additional programming steps.

Figure 2A:
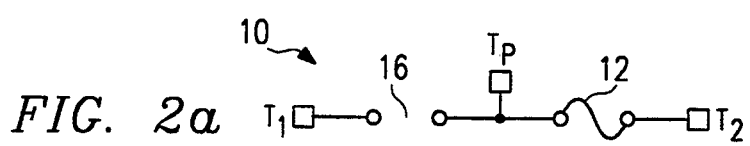
FIGS. 2a–2c show a series fuse and antifuse link allowing two programming steps, where the states depicted are.
Figure 2B:
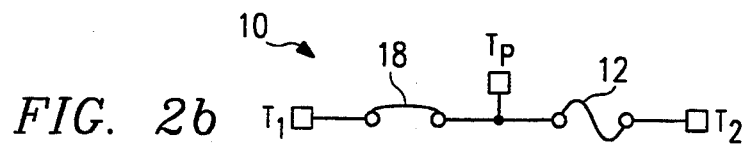
Figure 2C:
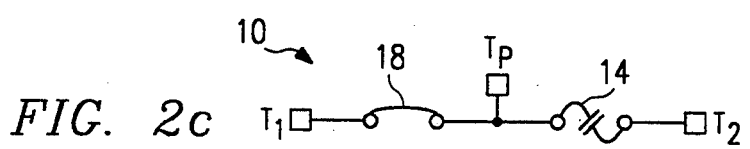

One embodiment of the invention is a basic link, which is twice programmable and consists of one fuse and one antifuse. In the first configuration, shown in FIG. 2, these two components are placed in series connection with the center node, $T_p$, accessible for programming. The initial state of the series fuse and antifuse link 10, shown in FIG. 2a, is open. The end nodes, labeled $T_1$ and $T_2$, are connected to gate inputs or outputs; these voltages, as well as the programming voltage, $T_p$, which may be applied to the center node, can be controlled during the programming process. In the first programming, a large potential difference may be applied between $T_1$ and $T_p$ to "blow" (i.e. connect) the antifuse 16, thereby changing the antifuse to the written state 18 and shorting the link as shown in FIG. 2b. It is recommended that $T_1$ be held low and $T_p$ taken to a high voltage, but the opposite sign of $(T_p-T_1)$ could also be used. In either case, $T_2$ should be held at the same potential as $T_p$ or be allowed to float in order to avoid high currents that could blow the fuse 12 during the first programming. The second programming step, which allows reversal of the link to its original open state, is accomplished by running a high current (not necessarily at a high voltage) through the fuse 12 in FIG. 2b via the $T_p$ and $T_2$ nodes to blow the fuse and open it. FIG. 2c shows the fuse 14 in the "written" state, with the link open.

A variation of this configuration is shown in FIG. 3, in which the programming nodes are omitted. An external current-limiting device (not shown) can be utilized with the schematic of FIG. 3a to enable programming without using a programming node. This can be achieved by, in the first programming step, applying a high voltage across T1 and T2, with the current limited so that the fuse 12 is not blown when the antifuse 16 is blown. The effect of the first programming step is shown in FIG. 3b. The second programming step is achieved by passing a high current through the fuse and antifuse link 10 (FIG. 3b), which blows the fuse 14 as shown in FIG. 3c, returning the circuit to the original open state.

In the second configuration is a parallel fuse and antifuse link 20, shown in FIG. 4a, the fuse 12 and antifuse 16 are placed in parallel, which also allows two programming steps. The link is initially shorted, as shown in FIG. 4a. The link can be programmed first to open it by applying a high current across $T_1$ and $T_2$ to blow the fuse 12, which converts the circuit as shown in FIG. 4b, with the fuse 14 open. The circuit shown in FIG. 4b can be programmed a second time by applying a high voltage to short it again by blowing the antifuse 16, leaving the circuit shown in FIG. 4c, with the antifuse 18 in the shorted state. Note that no separate programming voltage node is required, since the fuse can be blown by high current at low voltage without disturbing the antifuse. Once the fuse is blown, a high voltage may be applied across the two terminals to blow the antifuse.

Connections of multiple "sublinks" of the link types described above can be used to allow more than two programming steps. The circuit can be arranged in an array of series sublinks 30, by connecting series sublinks 24 in parallel as shown in FIG. 5. In this configuration, n series-type sublinks 24 may be connected in parallel to allow 2n programming steps. The configuration shown utilizes n separate $T_p$ terminals ($T_{p1}$, $T_{p2}$, ... $T_{pN}$) to individually program the sublinks. An alternate configuration without programming terminals is shown in FIG. 6. As in FIG. 4, if the current is limited when the high voltage is applied to blow the antifuse 16, then the fuse 12 will not be blown. Also, in order to reprogram the fuse and antifuse link structure depicted in FIG. 6, the thickness of the dielectric for the antifuses can be varied, so that all of the antifuses are not "blown" by the same voltage. More specifically, the thickness of the dielectric can be sequentially thicker for each antifuse in the array of sublinks.

Similarly, the circuit can be arranged in an array of parallel sublinks 34, by connecting parallel sublinks 26 in series as shown in FIG. 7, which also uses n sublinks to obtain 2n programming steps, but which requires one fewer terminals, i.e. a total of (n−1) programming terminals, $T_p$. The sequence of programming steps is similar to the programming of a single link, discussed previously. FIG. 8 shows the same circuit without the programming terminals. If the fuses are constructed with varying cross-sectional areas and amperage ratings, the fuse to be programmed could be selected by controlling the current.

An alternate embodiment of the circuit is shown in FIG. 9. This circuit contains a fuse 12 in parallel with a series sublink 24. Initially the circuit is shorted, as shown in FIG. 9a. A first programming step could be a high current (but low voltage) applied between nodes $T_1$ and $T_2$ which blows the fuse 12, causing the circuit to be an open, as shown in FIG. 9b. The second programming step involves applying a high voltage (but not a high enough current to blow the remaining fuse) which blows the antifuse 16, leaving the shorted circuit shown in FIG. 9c. In a third programming step, a high current applied blows the remaining fuse 12 leaving the open circuit shown in FIG. 9d.

Yet another possible alternate embodiment of the circuit includes the circuit shown in FIG. 10, which allows an almost unlimited number of fuses and antifuses to be reprogrammed with no need for a programming terminal. The number of elements in the circuit is generally limited merely by the amount of area available on the semiconductor wafer. See Table 2 for the programming steps available for this configuration.

TABLE 2

| Programming step | Signal Applied to $T_1$ and $T_2$ | Element "blown" | Subsequent State of Circuit |
| --- | --- | --- | --- |
| 0 (initial) | n/a | n/a | shorted |
| 1 | High current | $F_1$ | open |
| 2 | High voltage | $A_1$ | shorted |
| 3 | High current | $F_2$ | open |
| 4 | High voltage | $A_2$ | shorted |
| 5 | High current | $F_3$ | open |
| 6 | High voltage | $A_3$ | shorted |

TABLE 2-continued

| Programming step | Signal Applied to $T_1$ and $T_2$ | Element "blown" | Subsequent State of Circuit |
|---|---|---|---|
| 7 etc . . . | High current | $F_4$ | open |

A process flow for building either the series (FIG. 2) or parallel (FIG. 4) forms of the fuse and antifuse link will be described next. FIGS. 11a and 11b show cross-sectional views and top views (top views herein show only conductive or potentially conductive portions) of the series link using a dielectric breakdown antifuse, while FIG. 11c shows the application of this process to a parallel link in a top view. Both double level poly and single level metal are used.

For this embodiment, in a CMOS process, the n-wells and p-wells (not shown) are formed in the usual manner. Field oxide 44 is then formed, also in the usual manner, to isolate individual transistors from each other. Approximately 4500 Å of poly-silicon 40 is then deposited which forms (as shown in the top view) the fuse link 46, the bottom plate of a poly/dielectric/metal 1 antifuse 54, and it can, for example, be used as well to form the transistor gates (not shown). The resistivity of the poly can be in the range of 30 to 40 ohm/sq for the fuse link but is generally heavily doped with arsenic for the antifuse bottom plate. To meet these two criteria, first the poly 40 is $POCl_3$ doped to 30 ohm/sq resistivity followed by a patterning which exposes only the bottom plate area of the antifuse 54. A 1E16 dose of arsenic is then implanted, and the poly 40 is patterned and etched (sources and drains, not shown, are patterned and implanted in the usual manner). The fuse link 46 is formed by etching a region of poly 1 μm wide and 4 to 8 μm long. Later, if the fuse 46 is programmed, a high current pulse will blow the fuse 46 by causing the poly to melt.

A thick insulating oxide 48 is deposited to isolate the substrate and gate poly 40 from the metal interconnect 52. A fuse opening is then patterned and etched to the fuse bottom plate poly. A thin oxide is then thermally grown and a thin (e.g. LPCVD) nitride is deposited, forming the antifuse dielectric 50. A steam seal is then performed to improve the antifuse dielectric 50 followed by deposition of the polysilicon for the antifuse top plate 42. This polysilicon is also implant-doped with 1E16 arsenic and annealed to activate the arsenic. The poly is patterned and etched, forming the top plate 42 of the antifuse. Contacts 58 are then etched down to the poly 40, and the sources, drains and metal are deposited, patterned and etched forming interconnect in the usual manner.

In this embodiment, to blow the fuse 46, a 6 to 8 volt pulse of high (approximately 40 mA) current is applied across the fuse link 46. To blow the antifuse 54, a high voltage pulse of 18 volts is applied across the thin dielectric.

A second embodiment, incorporating a different method of forming an antifuse element, is shown in FIG. 12. The CMOS processing and fuse processing proceed as described above through the first poly 40 deposition and $POCl_3$ doping. The thick insulating oxide 48 is then deposited and the antifuse opening is etched., exposing the two ends of the poly conductors which will make contact to the antifuse as shown in FIG. 12a. An amorphous silicon plug 60 is then formed in the opening to form the antifuse material between the two poly conductors.

Contacts and metal (not shown) are then formed in the usual manner to complete the process, with the final structure shown in FIG. 12b. In this embodiment, an 8 to 10 volt pulse with high current can be used either to blow the fuse element 46, or to convert the highly resistive, amorphous silicon antifuse 64 element into a highly-conductive poly-silicon link. As shown in the top view of FIG. 12c, this embodiment can be used in a series link, which provides a $T_p$ terminal to individually address the two elements. It is more difficult to use the amorphous silicon antifuse in circuits without a $T_p$ terminal (e.g. with the parallel link of FIG. 4 because the same type of pulse is generally required to blow both fuses and antifuses.

An alternate method of implementing a parallel fuse and antifuse link in the manufacturing process is to combine the fuse and antifuse in close proximity in order to minimize space, as shown in FIG. 13. In this configuration the elements of the fuse and antifuse link take up about the same space as a single fuse 46 does.

Another alternate embodiment or use of the fuse and antifuse link is shown in FIG. 14. This "six-pack" contains three fuses ($F_1$, $F_2$ and $F_3$) and three antifuses ($A_1$, $A_2$, and $A_3$), as shown in FIG. 14a. Six reprogramming states are possible with this configuration. Programming terminals are not required, and neither is varying of the current or voltage ratings of the fuses and antifuses, respectively. In the "six-pack" embodiment, antifuse $A_1$ and fuse $F_1$ are connected in series between the first terminal $T_1$ and the second terminal $T_2$. Fuse $F_2$ and antifuse $A_2$ are connected in series to form a first series sublink, which is connected in parallel with fuse $F_1$. Fuse $F_3$ and antifuse $A_3$ are also connected in series to form a second series sublink, which is connected in parallel with fuse $F_2$. The six programming steps possible are (all voltages and currents may be applied across terminals $T_1$ and $T_2$):

1) applying a voltage across antifuse $A_1$, blowing it and programming it closed;
2) applying a current through fuse $F_1$, blowing it and programming it open, thus reversing step 1);
3) applying a voltage across antifuse $A_2$, blowing it and programming it closed, thus reversing step 2);
4) applying a current through fuse $F_2$, blowing it and programming it open, thus reversing step 3);
5) applying a voltage across antifuse $A_3$, blowing it and programming it closed, thus reversing step 4); and
6) applying a current through fuse $F_3$, blowing it and programming it open, thus reversing step 5).

A possible lay-out of the circuit on a semiconductor wafer is shown in FIG. 14b.

While the fuse and antifuse link invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A reprogrammable electrical circuit comprising:
   a first terminal;
   a second terminal;

a link, connected between said first terminal and said second terminal, wherein said link includes at least one fuse and at least one antifuse, said fuse and said antifuse being connected together in series, whereby the circuit is reprogrammable so as to alternatively open and close an electrically conductive path between said first terminal and said second terminal;

a first fuse and a first antifuse connected in series to form a first series sublink, said first series sublink connected on one end to said first terminal and on the other end to said second terminal;

a second fuse, connected in parallel with said first series sublink, wherein said link comprises said first sublink and said second fuse, whereby allowing reprogramming of said semiconductor device more than once; and a second antifuse and a third fuse connected in series to form a second series sublink, said second series sublink connected in parallel with said first fuse, whereby allowing programming of said semiconductor device more than once.

2. A reprogrammable electrical circuit comprising:
a first terminal;
a second terminal;
a link, connected between said first terminal and said second terminal, wherein said link includes at least one fuse and at least one antifuse, said fuse and said antifuse being connected together in series, whereby the circuit is reprogrammable so as to alternatively open and close an electrically conductive path between said first terminal and said second terminal;
a first antifuse and a first fuse connected in series between said first terminal and said second terminal;
a second fuse and a second antifuse connected in series to form a series sublink, said series sublink connected in parallel with said first fuse, wherein said link comprises said first antifuse, said first fuse and said series sublink, whereby allowing reprogramming of said semiconductor device more than once.

3. An array of sublinks for an integrated circuit, said array comprising:
a first terminal;
a second terminal;
at least two sublinks, wherein said sublinks consist of; one fuse and one antifuse connected in series;
wherein said sublinks are connected in parallel and whereby the circuit is reprogrammable so as to selectively define an electrically conductive path between said input terminal and said output terminal.

4. The array of claim 3 wherein said integrated circuit is part of a gate array or PROM.

5. The array of claim 3 further comprising a programming terminal connected between said fuse and said antifuse.

6. A method of altering a connection within a semiconductor device in order to allow reprogrammability, comprising the steps of:
a) fabricating a semiconductor device with a first fuse and first antifuse connected in series to form a first series sublink, a second fuse and second antifuse connected in series to form a second series sublink, where said second antifuse is a higher voltage antifuse and blows at a higher voltage than said first antifuse; where said first series sublink and said second series sublink are connected in parallel between said first terminal and said second terminal to allow reprogramming said semiconductor device more than once, and wherein said first series sublink connected between a first terminal and a second terminal;
b) applying a voltage across said first antifuse, blowing said first antifuse and programming said first antifuse closed; then
c) applying a current through said first fuse, thereby blowing said first fuse and programming said first fuse open; then
d) applying a voltage across said second antifuse, thereby blowing said second antifuse and programming said second antifuse closed; then
e) applying a current through said second fuse, thereby blowing said second fuse and programming said second fuse open.

7. The method of claim 6 wherein said first series sublink is also comprised of a first programming terminal connected between said first fuse and said first antifuse, wherein said second series sublink is also comprised of a second programming terminal connected between said second fuse and said second antifuse, and wherein the connection of said device is altered by:
a) said applying a voltage across said first antifuse by utilizing said first programming terminal to apply a voltage to said first antifuse, thereby blowing said first antifuse and programming said first antifuse closed; then
b) said applying a current through said first fuse thereby blowing said first fuse and programming said first fuse open; then
c) utilizing said second programming terminal to apply a voltage to said second antifuse, thereby blowing said second antifuse and programming said second antifuse closed; then
d) applying a current to said second fuse, thereby blowing said second fuse and programming said second fuse open.

8. The method of claim 7 wherein said applying a current through said first fuse is performed by applying the electrical signal across said first programming terminal and said second terminal.

9. The method of claim 7 wherein said applying a current through said first fuse is performed by applying the electrical signal across said first terminal and said second terminal.

10. The method of claim 7 wherein said applying a current to said second fuse is performed by applying the electrical signal across said second programming terminal and said second terminal.

11. The method of claim 7 wherein said applying a current to said second fuse is performed by applying the electrical signal across said first terminal and said second terminal.

12. A method of altering a connection within a semiconductor device in order to allow reprogrammability, comprising the steps of:
a) fabricating a semiconductor device with a first fuse and first antifuse connected in parallel to form a first parallel sublink, a second fuse and a second antifuse connected in parallel to form a second parallel sublink, where said second fuse is a higher current fuse and blows at a higher current than said first fuse, where said first parallel sublink and said second parallel sublinks are connected in series between said first terminal and said second terminal to allow reprogramming said semiconductor device more than once;

b) applying a current through said first fuse, thereby blowing said first fuse and programming said first fuse open, then;

c) applying a voltage across said first antifuse, blowing said first antifuse and programming said first antifuse closed, then;

d) applying a current through said second fuse, thereby blowing said second fuse and programming said second fuse open; then e) applying a voltage across said second antifuse, thereby blowing said second antifuse and programming said second antifuse closed.

13. The method of claim 12 further comprising a first programming terminal connected between said first parallel sublink and said second parallel sublink, and wherein the connection of said device is altered by:

b) said applying a current through said first fuse by applying a current through said first terminal and said first programming terminal to said first fuse, thereby blowing said first fuse and programming said first fuse open; then c) said applying a voltage across said first antifuse, thereby blowing said first antifuse and programming said first antifuse closed; then d) applying a current to said second fuse through said first programming terminal and said second terminal, thereby blowing said second fuse and programming said second fuse open; then e) applying a voltage across said second antifuse, thereby blowing said second antifuse and programming said second antifuse closed.

14. The method of claim 13 wherein said applying a voltage across said first antifuse is performed by applying said voltage across said first terminal and said first programming terminal.

15. The method of claim 13 wherein said applying a voltage across said first antifuse is performed by applying said voltage across said first terminal and said second terminal.

16. The method of claim 13 wherein said applying a voltage across said second antifuse is performed by applying said voltage across said first programming terminal and said second terminal.

17. The method of claim 13 wherein said applying a voltage across said second antifuse is performed by applying said voltage across said first terminal and said second terminal.

18. A method of altering a connection within a semiconductor device in order to allow reprogrammability, comprising the steps of;

a) fabricating a semiconductor device with a first fuse and first antifuse connected in series to form a first series Sublink, wherein said first series sublink is connected in parallel with a second fuse between a first terminal and a second terminal, further comprising a second antifuse and a third fuse connected in series to form a second series sublink, said second series sublink;

b) applying a current through said second fuse by applying an electrical signal across said first terminal and said second terminal, thereby blowing said second fuse and programming said second fuse open; then c) applying a voltage across said first antifuse by applying said voltage across said first terminal and said second terminal, thereby blowing said first antifuse and programming said first antifuse closed; then d) applying a current through said first fuse by applying an electrical signal across said first terminal and said second terminal, thereby blowing said first fuse and programming said first fuse open; then e) applying a voltage to said second antifuse by applying said voltage across said first terminal and said second terminal, thereby blowing said second antifuse and programming said second antifuse closed; then, f) applying a current to said third fuse by applying an electrical signal across said first terminal and said second terminal, thereby blowing said third fuse and programming said third fuse open.

19. A method of altering a connection within a semiconductor device in order to allow reprogrammability, comprising the steps of:

a) fabricating a semiconductor device with a first fuse and first antifuse connected in series between a first terminal and a second terminal, a second fuse and second antifuse connected in series to form a series sublink, where said series sublink connected in parallel with said first fuse;

applying a voltage across said first antifuse by applying said voltage across said first terminal and said second terminal, thereby blowing said first antifuse and programming said first antifuse closed; then c) applying a current through said first fuse by applying an electrical signal across said first terminal and said second terminal, thereby blowing said first fuse and programming said first fuse open; then d) applying a voltage across said first terminal and said second terminal, thereby blowing said second antifuse and programming said second antifuse closed; then e) applying a current through said first terminal and said second terminal, thereby blowing said second fuse and programming said second fuse open.

20. A reprogrammable electrical circuit comprising:

a first terminal;

a second terminal;

a link, connected between said first terminal and said second terminal, wherein said link includes at least one fuse and at least one antifuse, said fuse and said antifuse being connected together in parallel, whereby the circuit is reprogrammable so as to alternatively open and close an electrically conductive path between said first terminal and said second terminal a first fuse and a first antifuse connected in series to form a first series sublink, said first series sublink connected on one end to said first terminal and on the other end to said second terminal;

a second fuse, connected in parallel with said first series sublink, wherein said link comprises said first sublink and said second fuse, whereby allowing reprogramming of said semiconductor device more than once; and a second antifuse and a third fuse connected in series to form a second series sublink, said series sublink connected in parallel with said first fuse, whereby allowing programming of said semiconductor device more than once.

21. A reprogrammable electrical circuit comprising:

a first terminal;

a second terminal;

a link, connected between said first terminal and said second terminal, wherein said link includes at least one fuse and at least one antifuse, said fuse and said antifuse being connected together in parallel, whereby the circuit is reprogrammable so as to alteratively open and close an electrically conductive path between said first terminal and said second terminal; a first antifuse and a first fuse connected in series between said first terminal and said second terminal; and a second fuse and a second antifuse connected in series to form a series sublink, said series sublink connected in parallel with said first fuse, wherein said link comprises said first antifuse, said first fuse and said series sublink, whereby allowing reprogramming of said semiconductor device more than once.

22. An array of sublinks for an integrated circuit, said array comprising:

a first terminal;

a second terminal;

at least two sublinks, wherein said sublinks consist of one fuse and one antifuse connected in parallel;

wherein said sublinks are connected in series and whereby the circuit is reprogrammable so as to selectively define an electrically conductive path between said input terminal and said output terminal.

23. The array of claim 22 further comprising a programming terminal between said sublinks.

* * * * *